(12) United States Patent
Patel et al.

(10) Patent No.: US 7,719,754 B2
(45) Date of Patent: May 18, 2010

(54) MULTI-THICKNESS LAYERS FOR MEMS AND MASK-SAVING SEQUENCE FOR SAME

(75) Inventors: Sapna Patel, Fremont, CA (US); Fan Zhong, Fremont, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 0 days.

(21) Appl. No.: 12/242,189

(22) Filed: Sep. 30, 2008

(65) Prior Publication Data

US 2010/0079847 A1    Apr. 1, 2010

(51) Int. Cl.
  *G02B 26/00*    (2006.01)
  *G02B 26/08*    (2006.01)
(52) U.S. Cl. .................... 359/290; 359/223; 359/301
(58) Field of Classification Search ......... 359/290–292, 359/198, 223–225, 245, 260–263, 298, 295, 359/301–303, 317–318
  See application file for complete search history.

(56) References Cited

U.S. PATENT DOCUMENTS

| | | | |
|---|---|---|---|
| 4,900,395 A | 2/1990 | Syverson et al. |
| 5,030,319 A | 7/1991 | Nishino et al. |
| 5,330,617 A | 7/1994 | Haond |
| 5,358,601 A | 10/1994 | Cathey |
| 5,401,983 A | 3/1995 | Jokerst et al. |
| 5,422,310 A | 6/1995 | Ito |
| 5,567,334 A | 10/1996 | Baker et al. |
| 5,622,814 A | 4/1997 | Miyata et al. |
| 5,641,391 A | 6/1997 | Hunter et al. |
| 5,683,591 A | 11/1997 | Offenberg |
| 5,726,480 A | 3/1998 | Pister |
| 5,759,334 A | 6/1998 | Kojima et al. |
| 5,785,877 A | 7/1998 | Sato et al. |
| 5,906,536 A | 5/1999 | Imazato et al. |
| 5,972,193 A | 10/1999 | Chou et al. |
| 6,040,937 A | 3/2000 | Miles |
| 6,107,177 A | 8/2000 | Lu et al. |
| 6,136,630 A | 10/2000 | Weigold |
| 6,194,323 B1 | 2/2001 | Downey et al. |

(Continued)

FOREIGN PATENT DOCUMENTS

DE     199 38 072     3/2000

(Continued)

OTHER PUBLICATIONS

Dai et al., "A CMOS surface micromachined pressure sensor," Journal of the Chinese institute of Engineers, 1999, vol. 22, No. 3 (May), pp. 375-380.

(Continued)

*Primary Examiner*—Scott J Sugarman
*Assistant Examiner*—Dawayne A Pinkney
(74) *Attorney, Agent, or Firm*—Knobbe, Martens, Olson & Bear LLP

(57) ABSTRACT

In various embodiments described herein, methods for forming a plurality of microelectromechanical systems (MEMS) devices on a substrate are described. The MEMS devices comprise x number of different sacrificial or mechanical structures with x number of different sacrificial structure thicknesses or mechanical structure stiffnesses and wherein the x number of sacrificial or mechanical structures are formed by x-1 depositions and x-1 masks.

35 Claims, 14 Drawing Sheets

U.S. PATENT DOCUMENTS

| | | | |
|---|---|---|---|
| 6,215,221 B1 | 4/2001 | Cabuz et al. |
| 6,297,072 B1 | 10/2001 | Tilmans et al. |
| 6,329,297 B1 | 12/2001 | Balish et al. |
| 6,545,335 B1 | 4/2003 | Chua et al. |
| 6,548,908 B2 | 4/2003 | Chua et al. |
| 6,650,455 B2 | 11/2003 | Miles |
| 6,674,562 B1 | 1/2004 | Miles |
| 6,710,908 B2 | 3/2004 | Miles et al. |
| 6,747,800 B1 | 6/2004 | Lin |
| 6,791,692 B2 | 9/2004 | Powell et al. |
| 6,794,119 B2 | 9/2004 | Miles |
| 6,814,814 B2 | 11/2004 | Collins et al. |
| 6,867,896 B2 | 3/2005 | Miles |
| 6,905,621 B2 | 6/2005 | Ho et al. |
| 6,912,022 B2 | 6/2005 | Lin et al. |
| 6,913,942 B2 | 7/2005 | Patel et al. |
| 6,939,472 B2 | 9/2005 | Schaadt et al. |
| 6,940,631 B2 | 9/2005 | Ishikawa |
| 7,016,095 B2 | 3/2006 | Lin |
| 7,027,200 B2 | 4/2006 | Shi et al. |
| 7,041,224 B2 | 5/2006 | Patel et al. |
| 7,042,643 B2 | 5/2006 | Miles et al. |
| 7,064,089 B2 | 6/2006 | Yamazaki et al. |
| 7,105,442 B2 | 9/2006 | Shan et al. |
| 7,123,216 B1 | 10/2006 | Miles |
| 7,256,922 B2 | 8/2007 | Chui et al. |
| 7,259,865 B2 | 8/2007 | Cummings et al. |
| 7,327,510 B2 | 2/2008 | Cummings et al. |
| 7,553,684 B2 | 6/2009 | Chui et al. |
| 7,566,664 B2 | 7/2009 | Yan et al. |
| 2002/0021485 A1 | 2/2002 | Pilossof |
| 2002/0075555 A1 | 6/2002 | Miles |
| 2002/0160125 A1 | 10/2002 | Johnson et al. |
| 2002/0195423 A1 | 12/2002 | Patel et al. |
| 2003/0003372 A1 | 1/2003 | Hutchinson |
| 2003/0062332 A1 | 4/2003 | Harris et al. |
| 2003/0073042 A1 | 4/2003 | Cernigliaro et al. |
| 2003/0073302 A1 | 4/2003 | Huibers |
| 2003/0077843 A1 | 4/2003 | Yamauchi et al. |
| 2003/0080082 A1 | 5/2003 | Chinn et al. |
| 2003/0118920 A1 | 6/2003 | Johnstone et al. |
| 2004/0051929 A1 | 3/2004 | Sampsell et al. |
| 2004/0063322 A1 | 4/2004 | Yang |
| 2004/0150915 A1 | 8/2004 | Thomas et al. |
| 2004/0161921 A1 | 8/2004 | Ryu |
| 2004/0163758 A1 | 8/2004 | Kagan et al. |
| 2004/0233503 A1 | 11/2004 | Kimura |
| 2005/0014317 A1 | 1/2005 | Pyo |
| 2005/0068608 A1 | 3/2005 | Campbell |
| 2006/0262380 A1* | 11/2006 | Miles .................... 359/290 |
| 2007/0004080 A1 | 1/2007 | Ouyang |
| 2007/0096300 A1 | 5/2007 | Wang et al. |
| 2007/0117396 A1 | 5/2007 | Wu et al. |
| 2009/0262412 A1 | 10/2009 | Chui et al. |

FOREIGN PATENT DOCUMENTS

| | | |
|---|---|---|
| DE | 198 47 455 | 4/2004 |
| EP | 0 008 347 | 3/1980 |
| EP | 0 035 299 | 9/1983 |
| EP | 1 745 864 | 1/2007 |
| JP | 07-106303 | 4/1995 |
| JP | 10-107339 | 4/1998 |
| JP | 11-097799 | 4/1999 |
| JP | 11-243214 | 9/1999 |
| JP | 2002-270575 | 9/2000 |
| JP | 2003-001598 | 1/2003 |
| JP | 2003-305697 | 10/2003 |
| JP | 2004-102022 | 4/2004 |
| JP | 2005-005696 | 1/2005 |
| KR | 2000-0033006 | 6/2000 |
| WO | WO 98/029748 | 7/1998 |
| WO | WO 01/63657 | 8/2001 |
| WO | WO 03/085728 | 10/2003 |
| WO | WO 2005/061378 | 7/2005 |
| WO | WO 2006/077390 | 7/2006 |

OTHER PUBLICATIONS

DeHon, Array-based architecture for FET-based, nanoscale electronics, IEEE Transactions on Nanotechnology, 2(1):23-32 Mar. 2003.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).

Gosch, "West Germany Grabs the Lead in X-Ray Lithography," Electronics, pp. 78-80 (Feb. 5, 1987).

Harnett et al. Heat-Depolymerizable polycarbonates as electron beam patternable sacrificial layers for nanofluidics J. Vax. Sci. Technol. B. 19 (6) Nov./Dec. 2001 pp. 2842-2845.

Howard et al., "Nanometer-Scale Fabrication Techniques," VLSI Electronics: Microstructure Science, vol. 5, pp. 145-153, and pp. 166-173 (1982).

Jerman et al., "A Miniature Fabry-Perot Interferometer Fabricated Using Silicon Micromachining Techniques," IEEE Electron Devices Society (1988).

Kawamura et al., Fabrication of fine metal microstructures packaged in the bonded glass substrates, Proceedings of SPIE, vol. 3893, pp. 486-493, 1999.

Lee, et al. "Electrostatic Actuation of Surface/Bulk Micro machines Single-Crystal Silicon Microresonators" International Conference on Intelligent Robots and Systems, vol. 2 pp. 1057-1062 Oct. 17-21, 1999.

Lee, et al. Dec. 1999, Surface/Bulk Micromachining (SBM) Process: A New Method for Fabricating Released Mems in Single Crystal Silicon, Journal of Microelectromechanical Systems, 8(4):409-416.

Little et al., "Vertically Coupled Microring Resonator Channel Dropping Filter," IEEE Photonics Technology Letters, vol. 11, No. 2, (1999).

Ma et al., "A novel integrated multistage optical MEMS-mirror switch architecture design with shuffle Benes inter-stage connecting principle," Optics Communications 242 (2004), pp. 179-189.

Microchem, LOR Lift-Off Resists Datasheet, 2002, 6 pp.

Schnakenberg, et al. TMAHW Etchants for Silicon Micromachining. 1991 International Conference on Solid State Sensors and Actuators-Digest of Technical Papers. pp. 815-818.

Watanabe et al., Reduction of microtrenching and island formation in oxide plasma etching by employing electron beam charge neutralization, Applied Physics Letters, 79:17(2698-2700), Oct. 22, 2001.

Williams, et al. Etch Rates for Micromachining Processing. Journal of Microelectromechanical Systems, vol. 5, No. 4, pp. 256-259, (Dec. 1996).

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

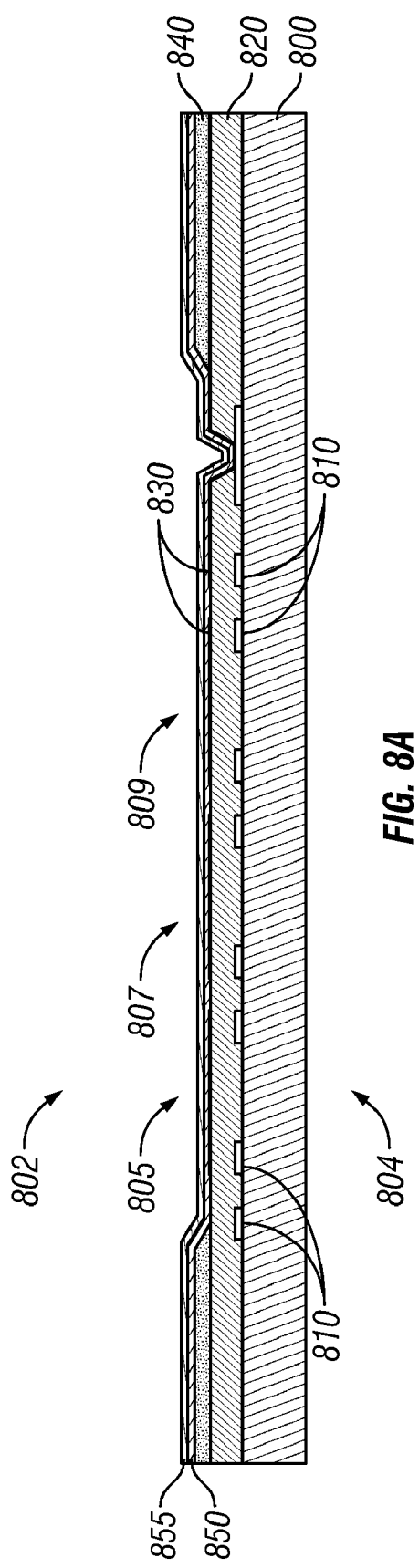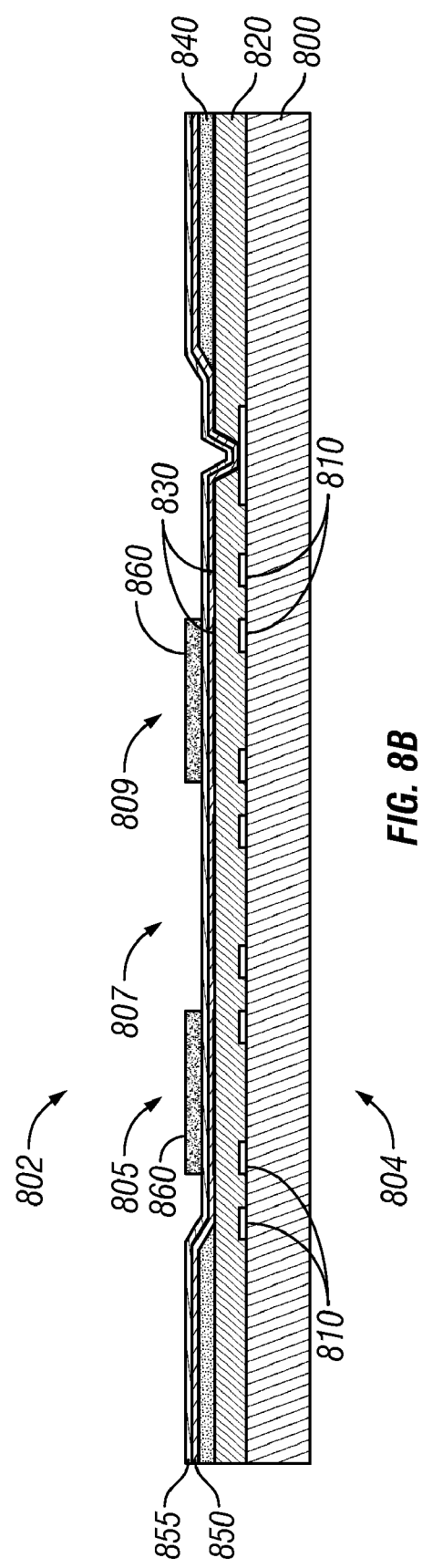

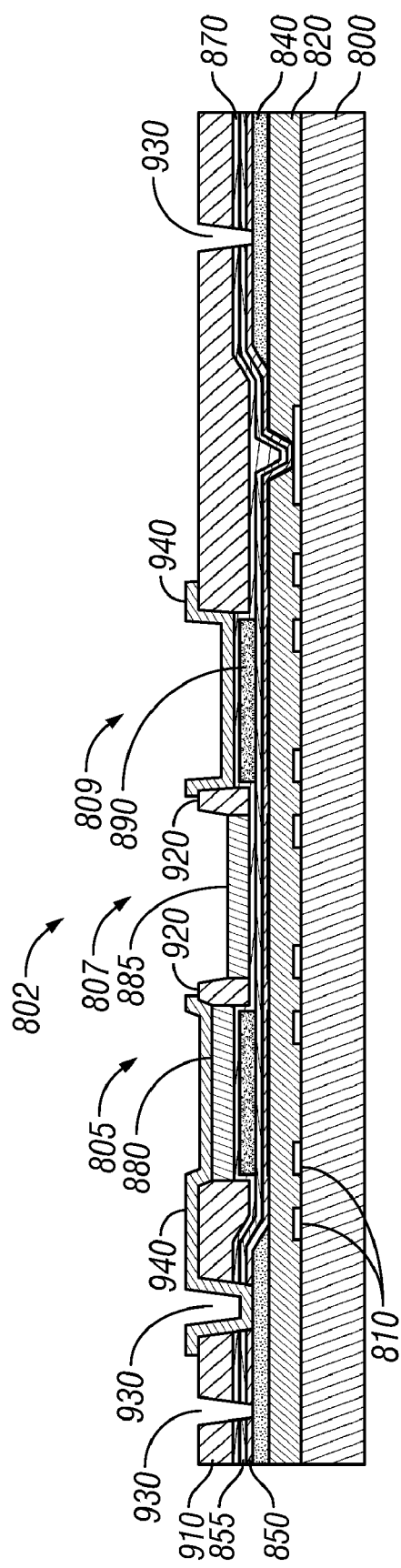
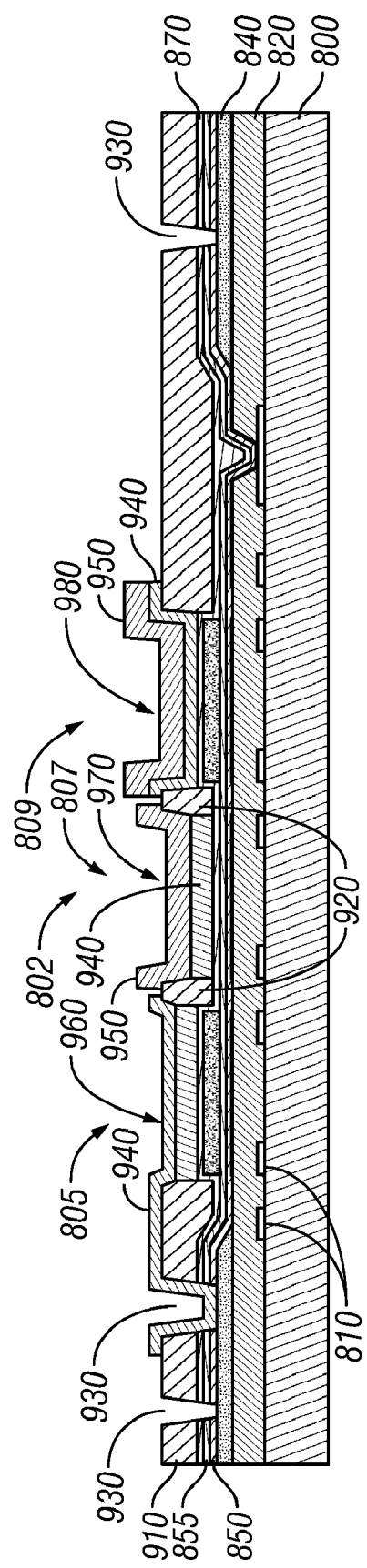
FIG. 9B
FIG. 9C

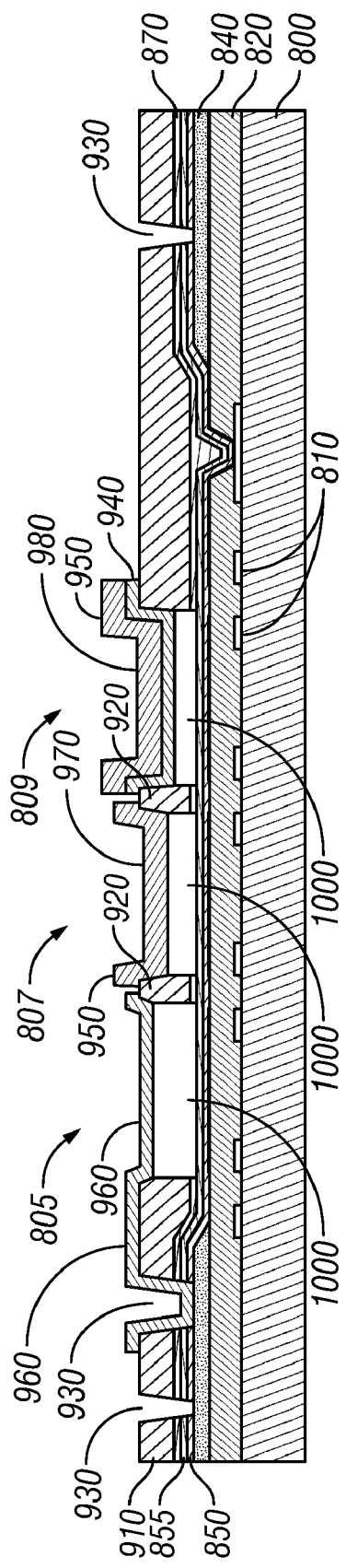

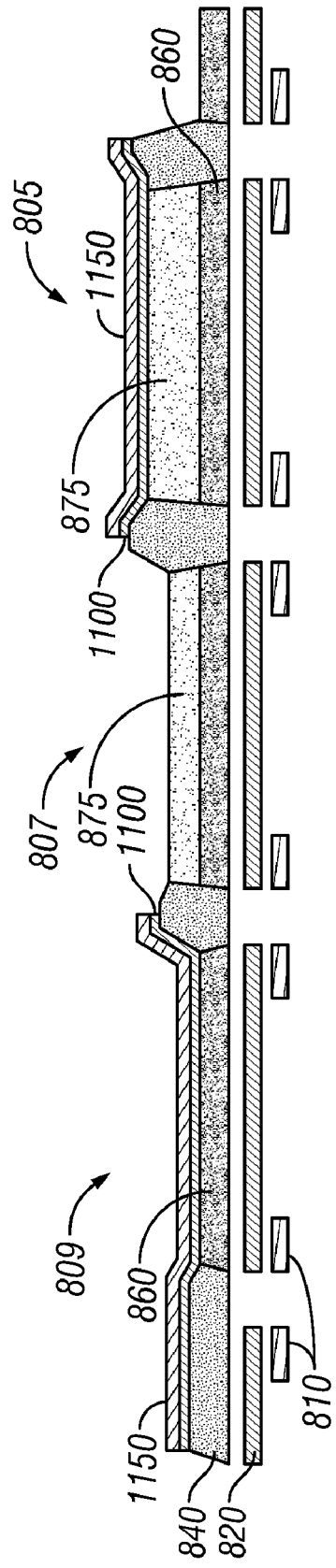
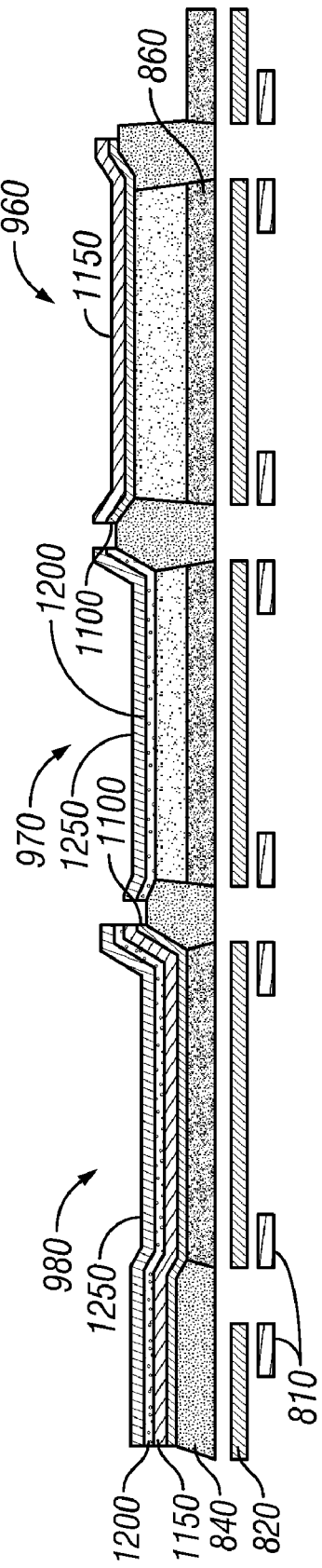
FIG. 11A
FIG. 11B

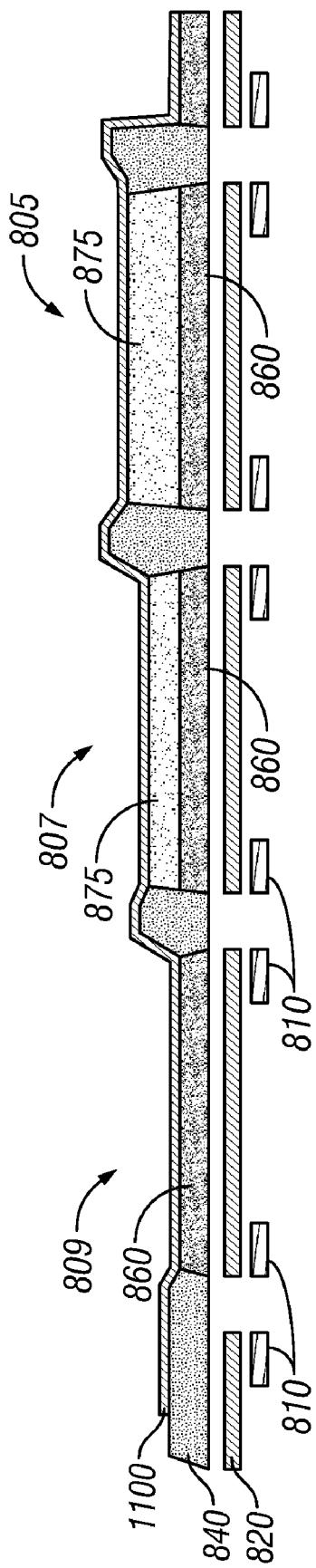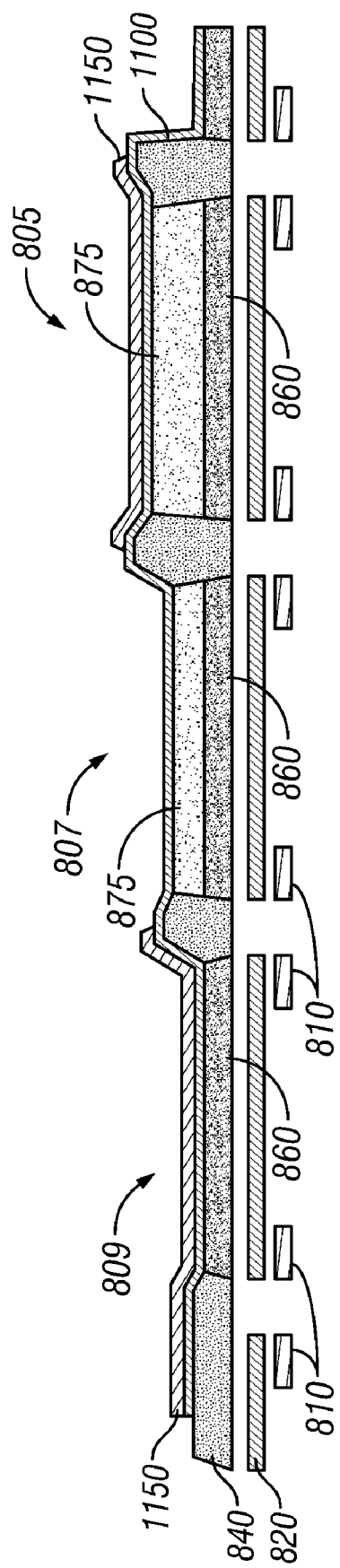

MULTI-THICKNESS LAYERS FOR MEMS AND MASK-SAVING SEQUENCE FOR SAME

CROSS-REFERENCE TO RELATED APPLICATIONS

The present application is related to U.S. patent application Ser. No. 11/090,911, filed Mar. 25, 2005; U.S. patent application Ser. No. 11/832,471, filed Aug. 1, 2007; U.S. patent application Ser. No. 11/939,746, filed Nov. 14, 2007; and U.S. Pat. No. 7,382,515, filed Jan. 18, 2006, issued Jun. 3, 2008.

BACKGROUND

1. Field of the Invention

The present invention is related to microelectromechanical systems (MEMS) and manufacturing processes for the same.

2. Description of Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In accordance with one embodiment, a method is provided for forming at least a first microelectromechanical systems (MEMS) device, a second MEMS device, and a third MEMS device, in a first region, a second region, and a third region, respectively. The method comprises providing a substrate in a reaction chamber, depositing a first sacrificial layer onto the first, second and third regions of the substrate, and patterning and etching the first sacrificial layer by removing the first sacrificial layer from the second region, while keeping the first sacrificial layer on the first and third regions. The method further comprises depositing a second sacrificial layer onto the first, second and third regions of the substrate and patterning and etching the second sacrificial layer by removing the second sacrificial layer from the third region, while keeping the second sacrificial layer on the first and second regions.

In accordance with another embodiment, a microelectromechanical systems (MEMS) device is provided. The MEMS devices comprises a first MEMS structure in a first region, a second MEMS structure in a second region, and a third MEMS structure in a third region. Each MEMS structure comprises a dielectric layer, an optical cavity having an optical cavity thickness formed from removing at least one sacrificial layer, and a mechanical layer. The optical cavity thickness of the first MEMS structure substantially equals the sum of the optical cavity thicknesses of the second and third MEMS structures.

In accordance with another embodiment, a method is provided for forming x number of different microelectromechanical systems (MEMS) structures on x regions of a substrate using x-1 depositions and x-1 masks where each of the x number of MEMS structures has a unique characteristic, where each characteristic corresponds to at least one of a first material and a second material. The method comprises depositing the first material onto the substrate, patterning and etching the first material by removing the first material from at least one region of the substrate. The method further comprises depositing the second material onto the substrate and patterning and etching the second material by removing the second material from at least one different region of the substrate.

In accordance with another embodiment, a method is provided for forming at least a first microelectromechanical systems (MEMS) device, a second MEMS device, and a third MEMS device in a first region, a second region, and a third region, respectively. The method comprises providing a substrate in a reaction chamber, depositing a first mechanical layer onto the first, second, and third regions of the substrate, and patterning and etching the first mechanical layer by removing the first mechanical layer from the second region, while keeping the first mechanical layer on the first and third regions. The method further comprises depositing a second mechanical layer onto the first, second and third regions of the substrate and patterning and etching the second mechanical layer by removing the second mechanical layer from the first region, while keeping the second mechanical layer on the second and third regions.

BRIEF DESCRIPTION OF THE DRAWINGS

FIG. 8A is a cross section of another embodiment of a partially fabricated interferometric modulator after formation of an optical stack.

FIG. 8B is a cross section of the interferometric modulator of FIG. 8A after a first sacrificial layer deposition and patterning with a first mask.

FIG. 9B is a cross section of the interferometric modulator of FIG. 9A after a first mechanical layer deposition and patterning with a first mask.

FIG. 9C is a cross section of the interferometric modulator of FIG. 9B after a second mechanical layer deposition and patterning with a second mask.

FIG. 10 is a cross section of the interferometric modulator of FIG. 9C after release of the sacrificial layers.

FIGS. 11A and 11B are cross sections of one method of forming the interferometric modulator of FIGS. 9B and 9C.

FIGS. 12A-12D are cross sections of another method of forming the interferometric modulator of FIGS. 9B and 9C.

DETAILED DESCRIPTION OF PREFERRED EMBODIMENTS

The following detailed description is directed to certain specific embodiments. However, the teachings herein can be applied in a multitude of different ways. In this description, reference is made to the drawings wherein like parts are designated with like numerals throughout. The embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Certain embodiments of the present invention are directed to the fabrication of integrated circuits to produce structures having different characteristics, such as for example, cavity size, which results in certain interferometric modulator colors, thickness (of the sacrificial, dielectric, or mechanical layers) or stiffness of materials, using a reduced number of depositions and masks. In some embodiments, a method is described for producing three MEMS structures with three optical cavity thicknesses by depositing and patterning two sacrificial layers. In certain embodiments, a method is described for producing three MEMS structures with three different mechanical layer stiffnesses by depositing and patterning two mechanical layers.

Figure 1:
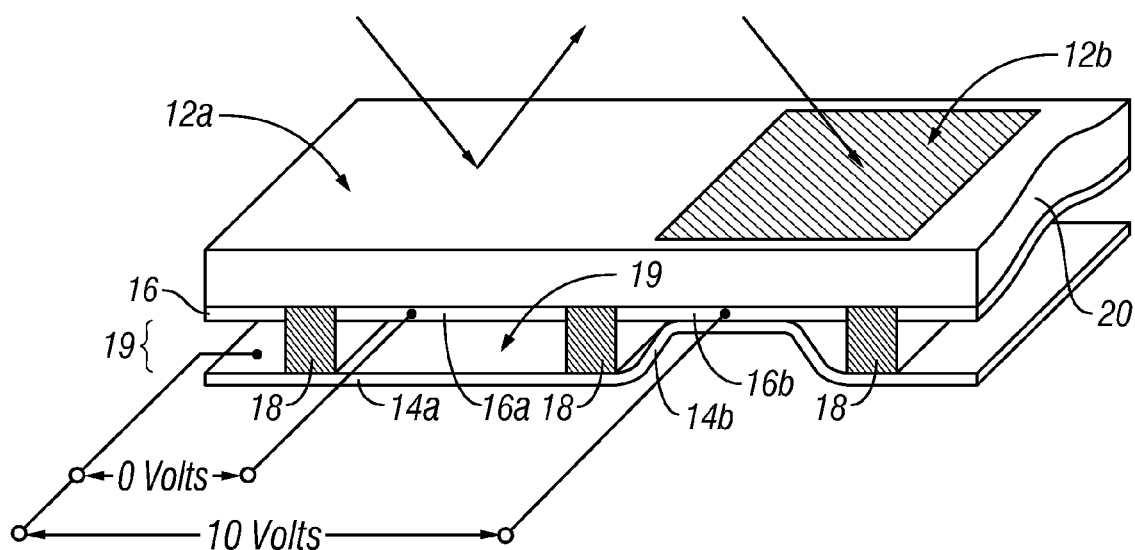
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
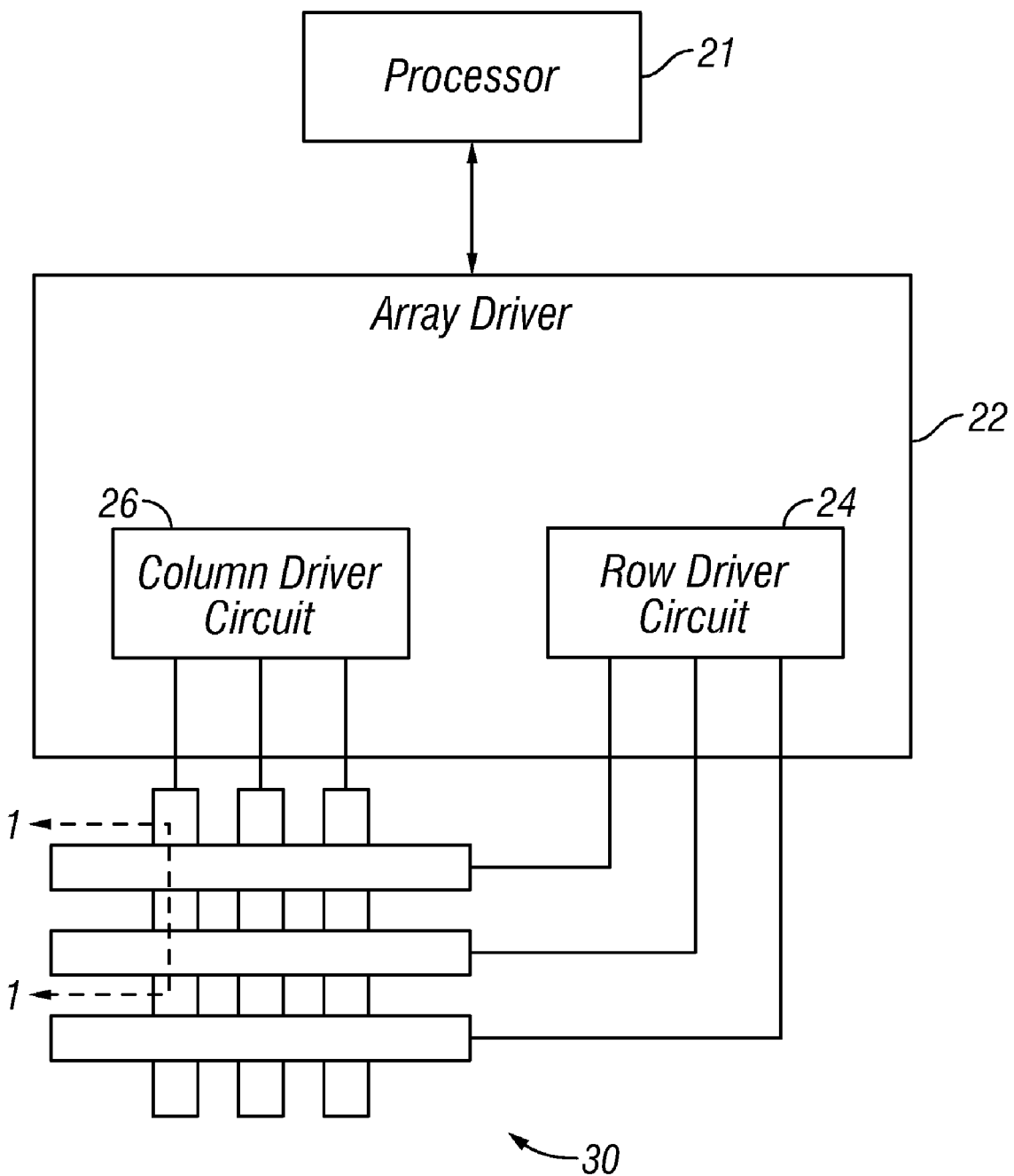
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
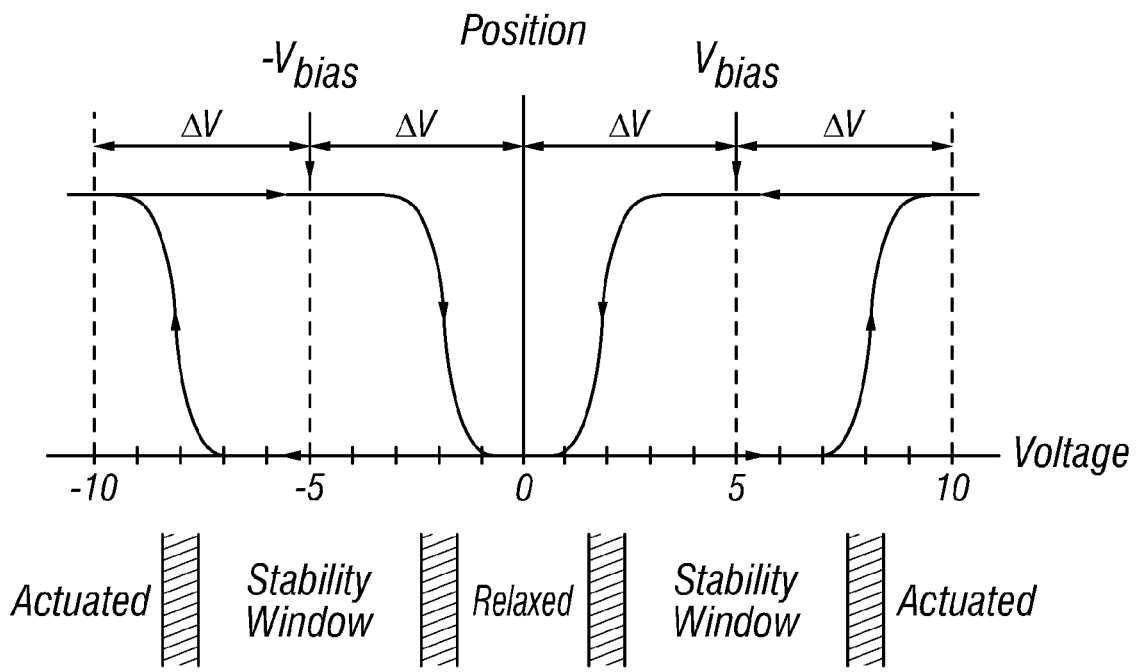
FIG. 3 is a diagram of movable minor position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable minor position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$ and the appropriate row to the same $-\Delta V$, producing a zero volt potential difference across the pixel.

Figure 5A:
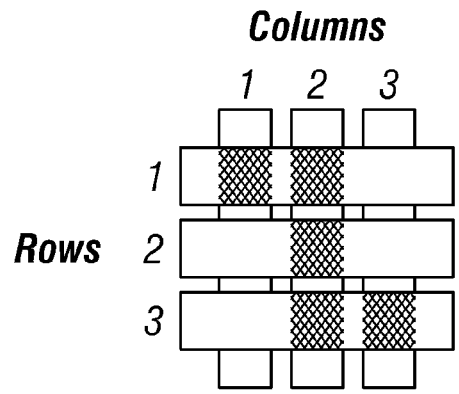
FIGS. 5A and 5B illustrate one exemplary timing diagram for row and column signals that may be used to write a frame of display data to the 3×3 interferometric modulator display of FIG. 2.
Figure 5B:
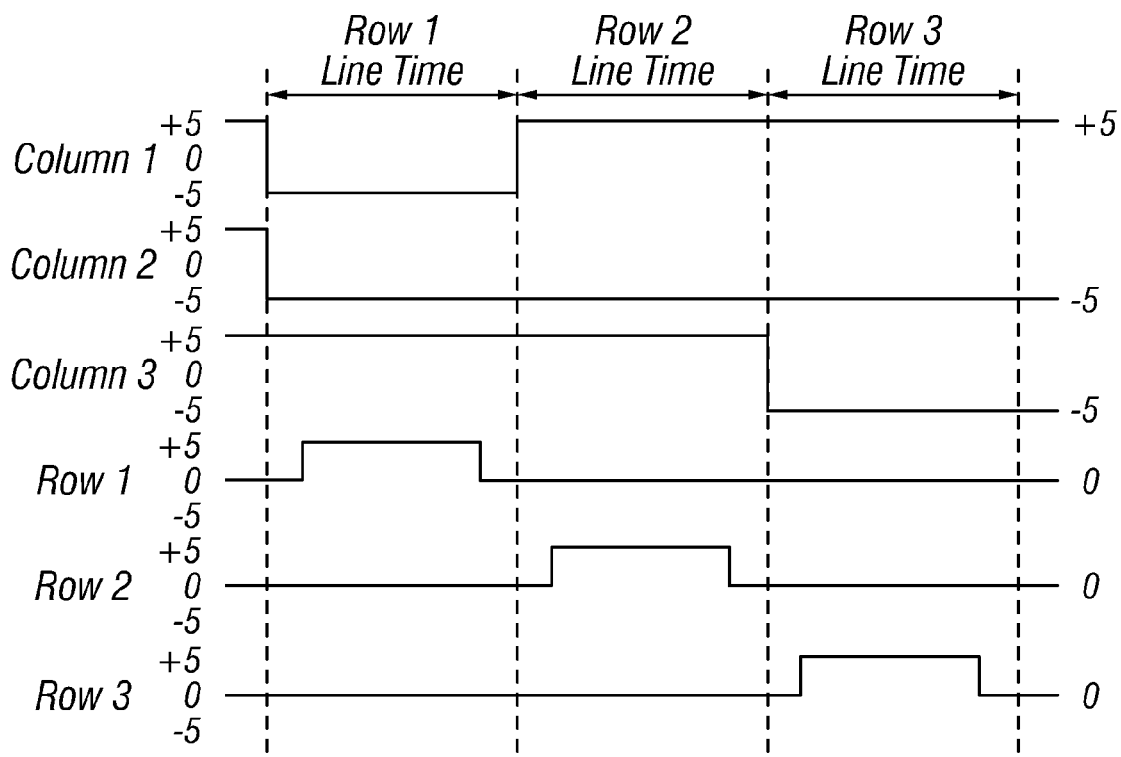

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
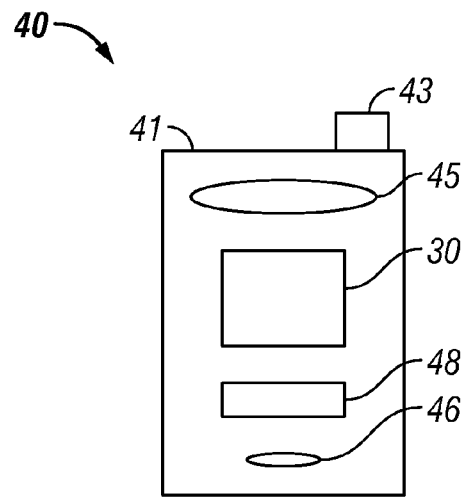
FIGS. 6A and 6B are system block diagrams illustrating an embodiment of a visual display device comprising a plurality of interferometric modulators.
Figure 6B:
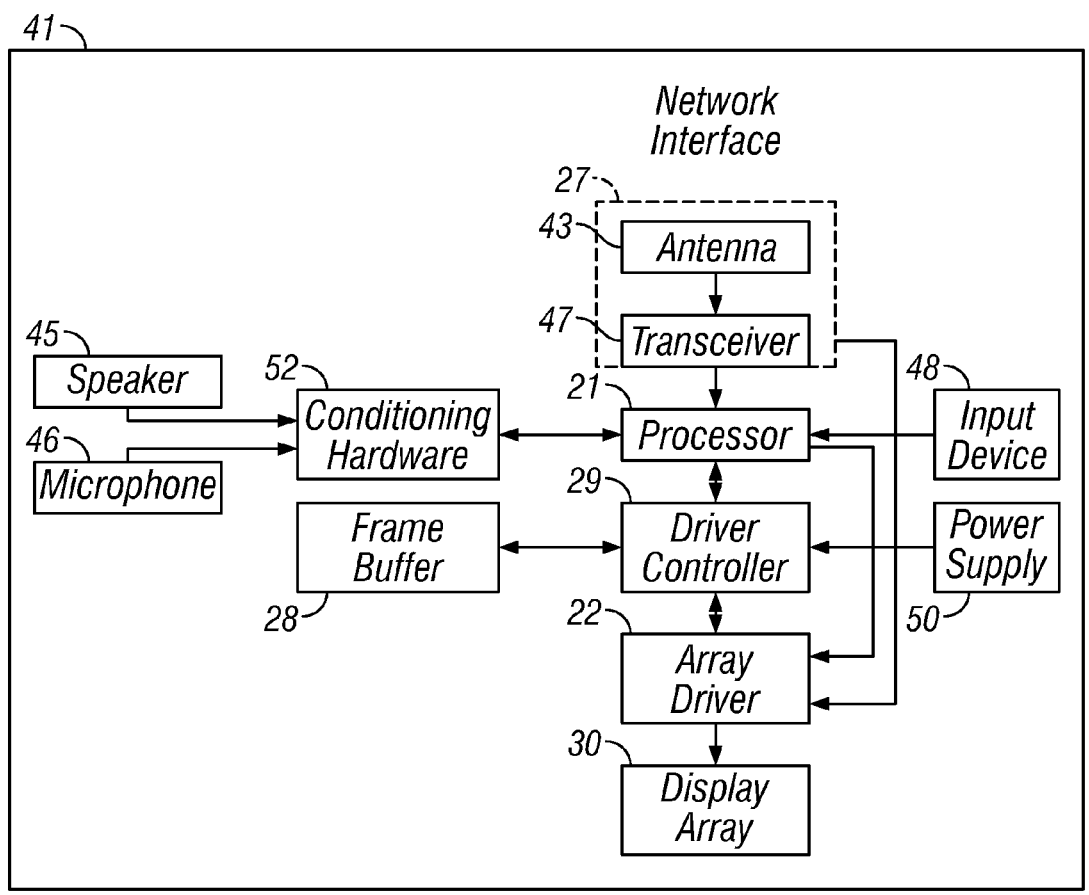

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
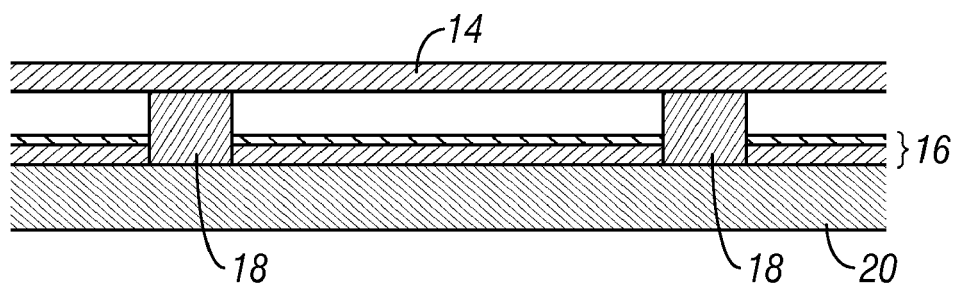
FIG. 7A is a cross section of the device of FIG. 1.
Figure 7B:
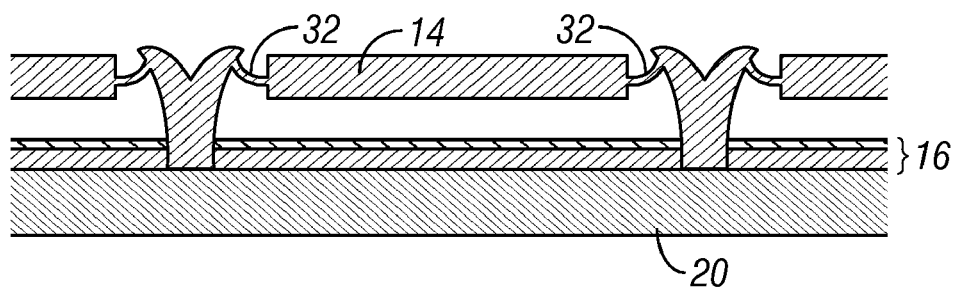
FIG. 7B is a cross section of an alternative embodiment of an interferometric modulator.
Figure 7C:
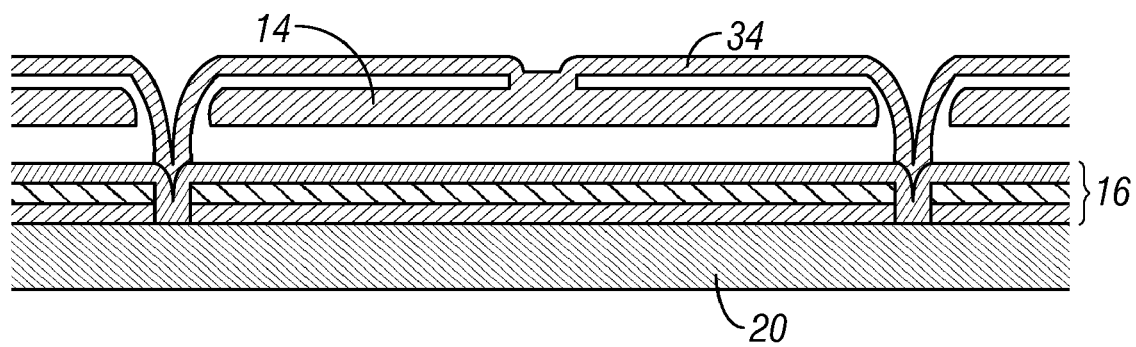
FIG. 7C is a cross section of another alternative embodiment of an interferometric modulator.
Figure 7D:
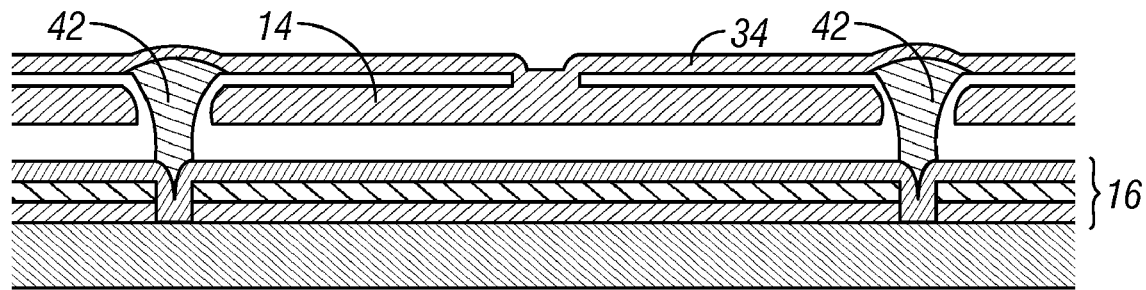
FIG. 7D is a cross section of yet another alternative embodiment of an interferometric modulator.
Figure 7E:
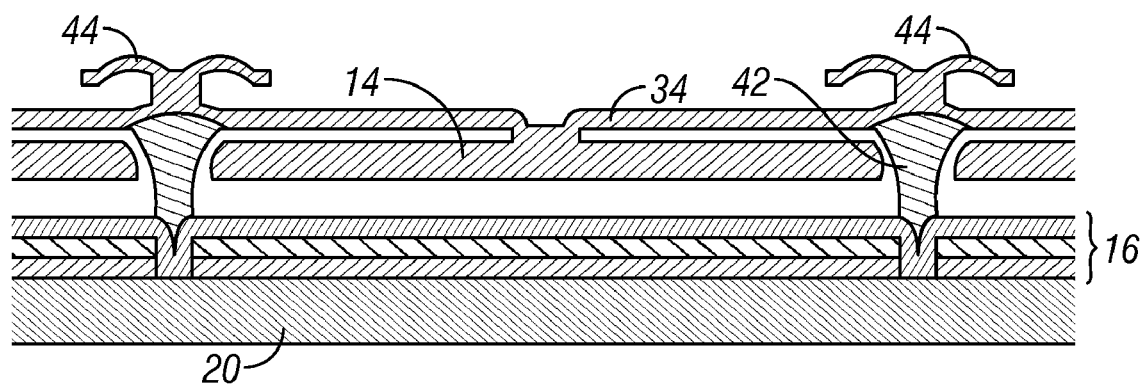
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Certain embodiments produce a MEMS device with a plurality of different MEMS structures. While FIGS. 8A-11B each illustrate a MEMS device including three MEMS structures with different characteristics, a person of skill in the art would understand that the disclosed method is applicable to any number of different MEMS structures on a substrate. For example, an IMOD array with MEMS of three different colors can be defined by three different thicknesses of sacrificial material and/or corresponds to mechanical layers of three different stiffnesses. Other characteristics may include different cavity sizes, leading to different colors of MEMS structures, thicknesses of dielectric layers, stress levels, resistances to etching, conductivities, and resistivities.

Figure 8C:
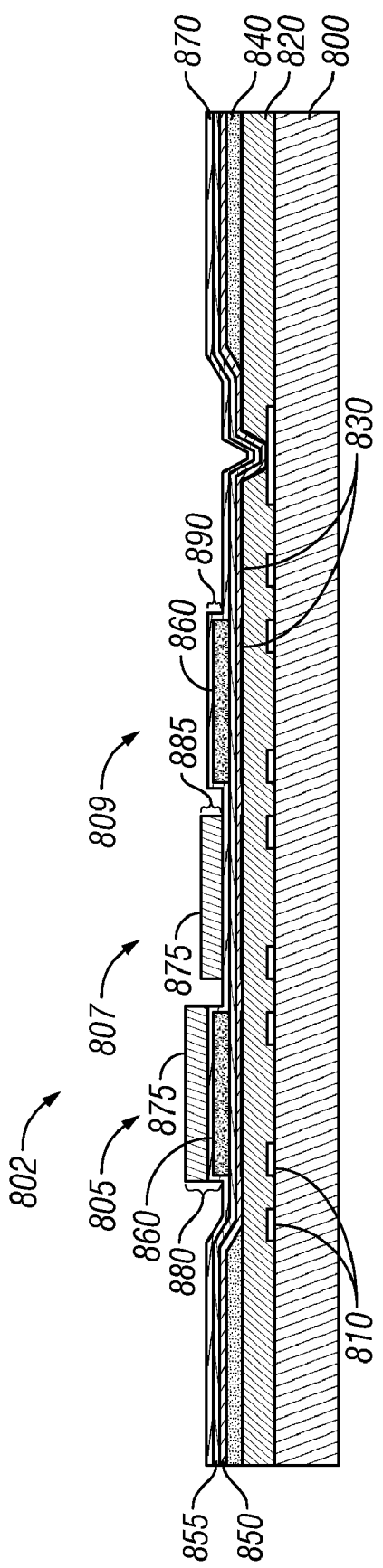
FIG. 8C is a cross section of the interferometric modulator of FIG. 8B after a second sacrificial layer deposition and patterning with a second mask.

FIGS. 8A-8C illustrate a method of forming three MEMS structures having three different optical cavity thicknesses, where the three optical cavities are formed by depositing and patterning two sacrificial layers.

FIG. 8A illustrates a substrate 800 on which three different MEMS structures will be formed. In the illustrated embodiment, the MEMS device comprises interferometric modulators (IMOD) as described with respect to FIGS. 1-7E, where at least three different IMODs are configured to reflect different colors in their respective relaxed or open states. The substrate has a back side 802, a front side 804, a first region 805, a second region 807, and a third region 809. A black mask 810 is deposited and patterned onto the substrate 800. In one embodiment, the black mask is an IMOD structure reflecting interferometric black, and may be formed of MoCr or Mo as a partially reflective absorber, $SiO_2$ as an optical cavity, and Al as a reflector. The MoCr thin film may be within about 70 Å to about 90 Å in thickness. The $SiO_2$ thin film may be within about 740 Å to about 780 Å in thickness. The Al thin film may be within about 280 Å to about 320 Å in thickness. In other embodiments, the black mask may be formed from dark absorbent material.

A dielectric layer in the form of a $SiO_2$ layer 820 is then deposited over the substrate 800. The $SiO_2$ layer 820 may be within about 2000 Å to about 8000 Å in thickness. In some embodiments, additional peripheral features are formed. As an example of this, FIG. 8A illustrates that a metal layer 840 is deposited and patterned at the periphery of the substrate 800 to be formed into features during later processing steps.

In some embodiments, an optical stack is formed next on the substrate 800. The optical stack may include an optical absorber layer 830, a transparent conductor layer (not separately called out), and a dielectric layer 850. In some embodiments, the optical absorber layer 830 is partially transparent and comprises about 40 Å to about 80 Å of MoCr. In some embodiments, the transparent conductor layer may be formed, e.g., of about 60 Å to about 100 Å of indium tin oxide (ITO) in order to increase conductivity of the absorber layer 830, which together with ITO forms lower, stationary electrodes connected in rows from the MEMS array. In some embodiments, the dielectric layer 850 may be formed of about 430 Å to about 470 Å of $SiO_2$ (or a functionally similar material), followed, in some embodiments, by a first etch stop layer 855. The first etch stop layer 855 may be formed of $Al_2O_3$ of about 50 Å to about 100 Å in thickness.

FIG. 8B illustrates certain embodiments of the present invention in which a first sacrificial layer 860 is deposited over the substrate 800. The thickness of the first sacrificial layer 860 represents the approximate optical cavity size of the smallest optical cavity of the three MEMS structures in the illustrated embodiment, but it could alternatively represent an intermediate sized optical cavity. In some embodiments, this corresponds to a first order green color in the resultant IMOD. For a fluorine-based release etch, such as $XeF_2$, the first sacrificial layer 860 may be formed of Mo, amorphous silicon, tungsten, or titanium of about 1500 Å to about 1700 Å in thickness. The first sacrificial layer 860 may then be patterned and etched such that the first sacrificial layer 860 remains over the first region 805 and the third region 809 of the substrate 800, but removed from the second region 807. The etchant may be selected to etch the exposed regions of the pattern while not etching through the etch stop layer 855.

FIG. 8C illustrates certain embodiments of the present invention in which a second etch stop layer 870, formed of about 100 Å to about 1000 Å of $Al_2O_3$, $SiN_x$, or another suitable material, with less than 200 Å being sufficient, is deposited over the substrate 800, followed by a second sacrificial layer 875. $SiN_x$ has the advantage that it can be removed by the same F-based etchants that remove the sacrificial material. The thickness of the second sacrificial layer 875 represents the approximate optical cavity size of the second smallest optical cavity of the three MEMS structures in the illustrated embodiment, but it could alternatively represent the smallest optical cavity. In some embodiments, this corresponds to the first order red color of the resultant IMOD. The thickness of the combination of the two sacrificial layers 860, 875, plus the etch stop layer 870, represents the approximate optical cavity size of the largest optical cavity of the three MEMS structures. In some embodiments, this corresponds to the second order blue color of the resultant IMOD.

The second sacrificial layer 875 may be formed of Mo, amorphous silicon, tungsten, or titanium of about 2100 Å to about 2500 Å in thickness (2450 Å). The second sacrificial layer 875 may then be patterned and etched such that the second sacrificial layer 875 remains over the first region 805 and the second region 807 of the substrate 800, but removed from the third region 809, resulting in a first, second, and third region 805, 807, 809 of three different thicknesses. The etchant may be selected to etch the exposed regions of the pattern while not etching through the second etch stop layer 870.

The sacrificial layers and their thicknesses are described with the assumption that the etch stop layer 870 is about 200 Å in thickness and is removed with the sacrificial layers, such that it adds to the optical cavities of all three MEMS structures. The skilled artisan can calculate other thicknesses for the sacrificial layers 860, 875 with other thicknesses of the etch stop 870. As the etch stop layer 870 is significantly thinner than the first and second sacrificial layers 860, 875, the resulting optical cavity thickness formed by the combined deposition of the first and second sacrificial layers 860, 875 substantially equals the sum of the optical cavity thickness of the MEMS structure formed by the deposition of the first sacrificial layer and the optical cavity thickness of the MEMS structure formed by the deposition of the second sacrificial layer. "Substantially" in this sense means plus or minus the thickness of the etch stop 870 in addition to the launch angle and the operational voltage considerations noted below.

A person of skill in the art would understand that the size of the optical cavity does not necessarily equal the thicknesses of the first and second sacrificial layers and any additional etch stop layers. Rather, after the sacrificial layers are etched and the upper electrodes are released, the upper electrodes respond to two competing forces. Firstly, the upper electrodes tend to move away from the substrate upon release due to inherent stresses in the mechanical layer, thereby increasing the size of the optical cavity. This behavior is known as the "launch angle." The operational voltage of the MEMS device in a relaxed state counteracts the launch angle by moving the upper electrodes towards the substrate, thereby decreasing the optical cavity size. The net result is that the optical cavity is 10-15% smaller than the thickness of the sum of the sacrificial layers and any etch stop layers. A skilled artisan, in determining the thickness of each layer, would therefore compensate for the net negative 10-15% difference due to the launch angle and operational voltage.

As can be seen in the illustrated embodiments, the optical cavity of the first region 805 corresponds to the thickness of the first and second sacrificial layers 860, 875 plus the second etch stop layer 870. The optical cavity of the second region 807 corresponds to the thickness of the second sacrificial layer 875 plus the second etch stop layer 870. The optical cavity of the third region 809 corresponds to the thickness of the first sacrificial layer 860 plus the second etch stop layer 870. Therefore, the thickness of the optical cavity of the first region 805 substantially equals the sum of the thicknesses of the optical cavities of the second and third regions 807, 809. More precisely, apart from the launch angle and operational voltage issues noted above, for the illustrated embodiment, the optical cavity of the first region 805 is equal to the sum of the optical cavities of the second and third regions 807, 809 less the thickness of the second etch step 870. That is because the sum of the thicknesses of the optical cavities of the second and third regions 807, 809 include twice the thickness of the second etch stop layer 870, whereas the thickness of the optical cavity of the first region 805 includes only one thickness of the second etch stop layer 870. While the second etch stop layers 870 is thinner than the first and second sacrificial layers 860, 875, a skilled artisan would likely still consider it in determining the desired optical cavity dimensions.

In certain embodiments of the present invention, as illustrated by FIG. 8C, the thickness of the optical cavity of the first sacrificial structure 880, or the sacrificial structure on the first region 805, produces a wavelength of light corresponding to a second order blue color when the first sacrificial structure 880 is in an open or relaxed state. The thickness of the optical cavity of the second sacrificial structure 885, or the sacrificial structure on the second region 807, produces a wavelength of light corresponding to a first order red color when the second sacrificial structure 885 is in an open or relaxed state. The thickness of the optical cavity of the third sacrificial structure 890, or the sacrificial structure on the third region 809, produces a wavelength of light corresponding to a first order green color when the third sacrificial structure 890 is in an open or relaxed state.

It will be appreciated by those skilled in the art that different sacrificial layer or etch stop layer materials may be used than those described, dimensions may be altered, and steps added or omitted within the scope of the invention. A skilled artisan would also recognize the modifications necessary to produce MEMS structures of varying colors than the MEMS structures described in the illustrated Figures.

deformable metal. In certain embodiments, the first mechanical layer 940, may form the thinnest of the three electrodes. In other embodiments, it may form an electrode of intermediate thickness. The first mechanical layer 940 is then patterned and etched such that it remains on the sacrificial structures 880, 890 of the first and third regions 805, 809, but is removed from the second region 807. In some embodiments, the first mechanical layer is also formed over certain features 930 in the periphery of the substrate 800.

In certain embodiments as shown in FIG. 9C, a second mechanical layer 950 forms the second mechanical structure 970 over the substrate 800. The second mechanical layer 950 may in some embodiments form the electrode of intermediate thickness and in other embodiments may form the thinnest

| Region | Sac Structure | Example of Sac Thickness | Interferometric Color | Operational Gap Range |
|---|---|---|---|---|
| Air Gap 1 | Sac Layer 1 + Sac Layer 2 + Etch Stop Layer | 4400Å | 2nd Order Blue | 310-390 nm |
| Air Gap 2 | Sac Layer 2 + Etch Stop Layer | 2650Å | 1st Order Red | 230-270 nm |
| Air Gap 3 | Sac Layer 1 + Etch Stop Layer | 1950Å | 1st Order Green | 170-190 nm |

As seen in the above chart, the air gap of the first MEMS device is formed by the removal of the first and second sacrificial layers and an etch stop layer. The sum of the sacrificial layers and etch stop layer is about 4400 Å. When the sacrificial layers and etch stop layer are etched and the overlying mechanical layer is released, the resulting gap size reduces by about 10-15% due to a combination of the "launch angle" caused by stress in the mechanical layer (tending to increase the cavity size) and the operational voltage that draws the upper electrode closer to the lower electrode even in the "relaxed" position (tending to decrease the cavity size). This results in a MEMS device having a second order blue color, with a range of between about 310 nm and 390 nm, in the open or relaxed state. The air gaps for the second and third MEMS devices are described in a similar fashion according to the above chart.

A person of skill in the art would recognize that different gap sizes, colors, and color ranges may be chosen. The larger gap size, corresponding to the gap in which a plurality of sacrificial layers has been removed, will typically have a larger gap range than the gaps formed by removing a single sacrificial layer. The air gap chart is calculated in combination with a particular optical stack. As the optical gap is the sum of the air gap plus the underlying dielectric layer, a person of skill in the art would recognize the adjustments necessary to both the air gap and dielectric layer to produce the desired color ranges.

Figure 9A:
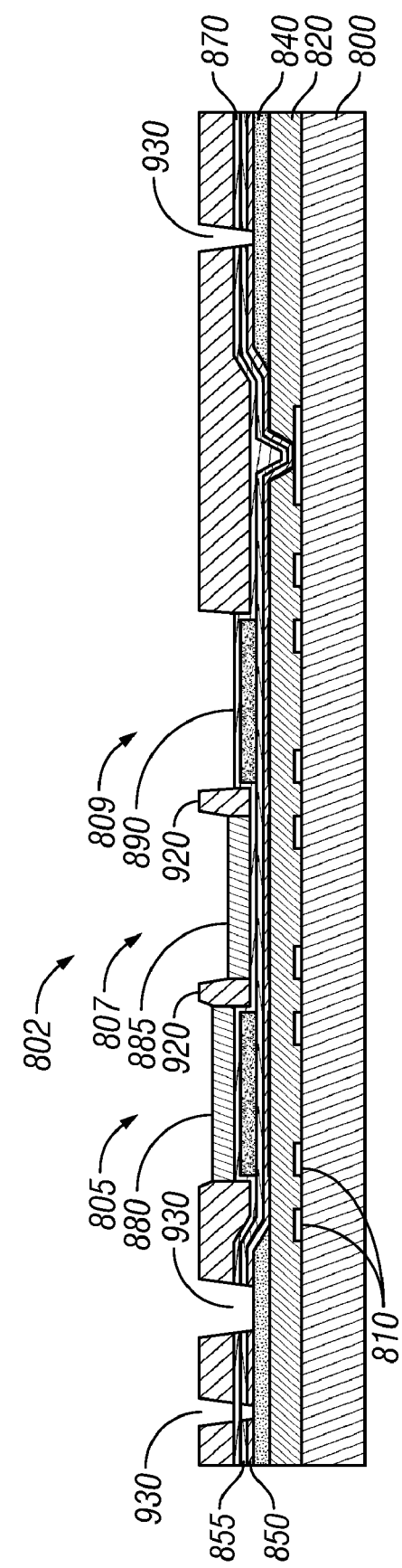
FIG. 9A is a cross section of the interferometric modulator of FIG. 8C after photoresist deposition, exposure, and developing for support and routing patterns.

Similar to the process of FIGS. 8A-8C, FIGS. 9A-9C illustrate a process of producing three MEMS structures with three mechanical stiffnesses using two depositions and two masks. In some embodiments as shown in FIG. 9A, a negative photoresist layer is deposited on the backside 802 (the processed side) of the substrate 800 of FIG. 8C. The front side 804 of the substrate 800 is then exposed to light to form support structures 920 between the light-blocking MEMS structures 880, 885, 890 and the back side 802 is masked and exposed to light to define additional features 930 in the periphery of the MEMS device.

In certain embodiments as shown in FIG. 9B, a first mechanical layer 940 may be formed by depositing a flexible membrane of about 950 Å to about 1050 Å of Ni, or a similar electrode. Also seen in FIG. 9C, the third and thickest mechanical structure 980 is formed by the combined deposition of the first mechanical layer 940 and the second mechanical layer 950. The second mechanical layer 950 may be formed by depositing a flexible membrane of about 1950 Å to about 2050 Å of Ni, or a similar deformable metal. The second mechanical layer 950 is then patterned and etched such that it remains over the second and third regions 807, 809, but is removed from the first region 805. As illustrated in FIG. 10, after depositing the first and second mechanical layers 940, 950, the first and second sacrificial layers 860, 875, which form the sacrificial structures 880, 885, 890, are removed to define MEMS cavities 1000 of three different sizes and the overlying mechanical structures 960, 970, 980 are released. The third electrode or mechanical structure 980, formed from the first and second mechanical layers 940, 950, corresponds with the smallest optical cavity.

While the above description of FIGS. 9A-9C focuses on the description of mechanical layers of different thicknesses, the skilled artisan will appreciate that the moving electrodes of an IMOD will also include a reflective or minor layer (e.g., a minor layer of about 250 Å to about 350 Å of Al, or a similar reflective metal). For embodiments such as FIG. 7A, the mechanical layer(s) can be integrated with the mirror layer, as described below for FIGS. 11A and 11B. For embodiments such as FIGS. 7C-7E: the minor can be first patterned over the sacrificial structures; an upper sacrificial structure formed over the minors; connectors formed through the upper sacrificial structure; and the mechanical layer(s) as described above formed thereover.

In one embodiment as seen in FIG. 11A, a first minor layer 1100 is deposited by blanket deposition. A first mechanical or flexible membrane 1150 is next deposited by blanket deposition. The first minor layer 1100 and the first flexible membrane 1150 are then patterned and etched together. In FIG. 11B, this process is repeated for a second mirror layer 1200 and a second mechanical flexible membrane 1250, thereby forming mechanical structures 960, 970, 980 as described for FIGS. 9A-9C. Thus, integrated mirror and mechanical layers of different thicknesses are formed to serve as tailored movable electrodes for MEMS of different cavity sizes. For example, the first mechanical membrane 1150 is formed over the first region 805 to function as the movable electrode of the MEMS device having the largest of the three different cavities. The second mechanical membrane 1250 is formed over the second region 807 to function as the movable electrode of the MEMS device having the medium-sized cavity. The first mechanical membrane 1150 and the second mechanical membrane 1250 combine to form a mechanical layer thicker and therefore stiffer than either the first or second mechanical membranes 1150, 1250 individually. The combined mechanical layer is formed over the third region 809 to function as the movable electrode of the MEMS device having the smallest cavity among the illustrated three.

Figure 12C:
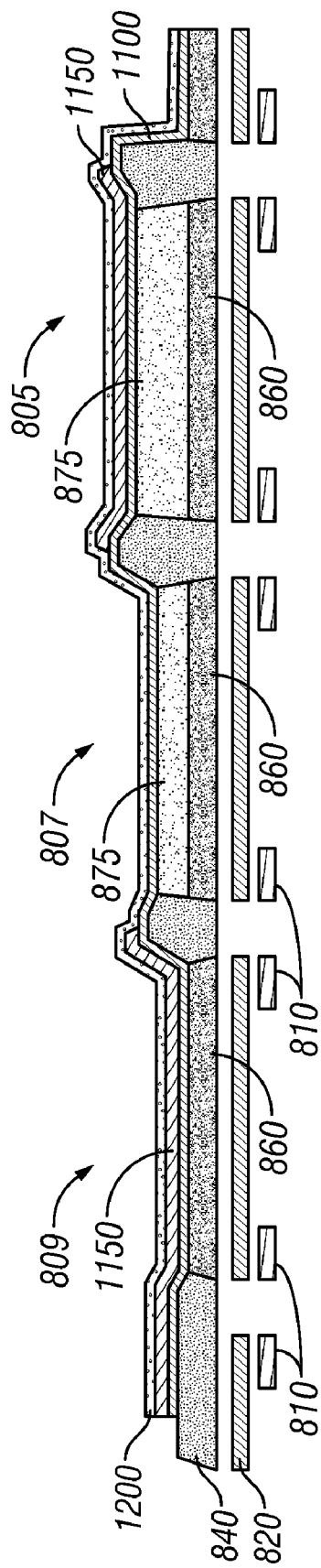
Figure 12D:
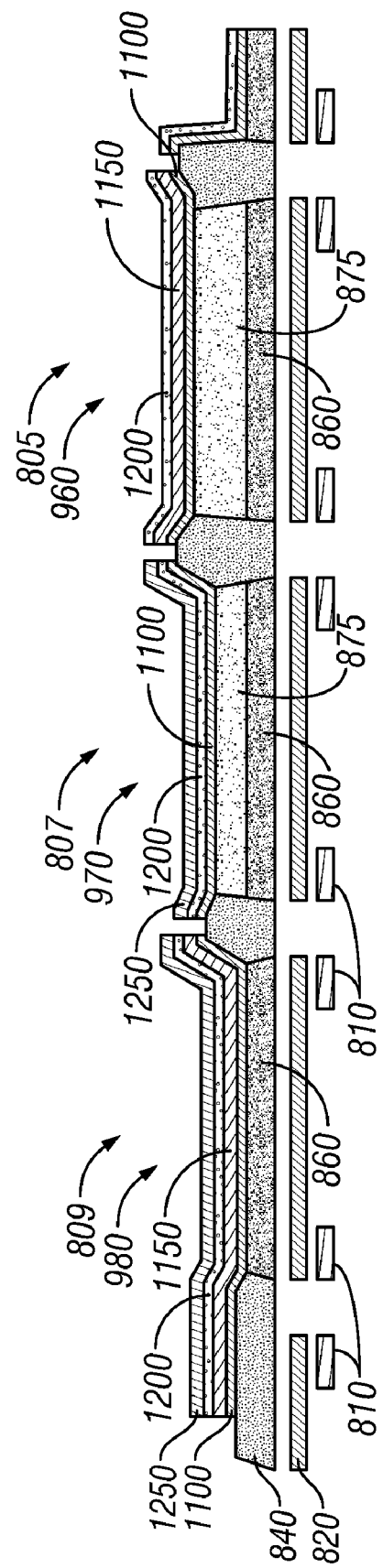

In another embodiment as seen in FIG. 12A, a first mirror layer 1100 is deposited by blanket deposition. FIG. 12B shows the first mechanical or flexible membrane 1150 deposited and patterned over the first minor layer 1100, which remains unpatterned. In certain embodiments depicted in FIG. 12C, an etch stop layer 1200 is deposited between the first and second mechanical or flexible membranes 1150, 1250. Then, as seen in FIG. 12D, the second mechanical or flexible membrane 1250 is deposited and patterned, without patterning the underlying layers to form mechanical structures 960, 970, 980 as described in FIGS. 9A-9C. Unlike the embodiment of FIG. 11A, the reflective or mirror material is deposited only once and is not embedded within the thickest mechanical structure 980. In the illustrated embodiment, however, the etch stop layer is embedded within the thickest mechanical structure.

In the illustrated embodiment, different mechanical layer stiffnesses are achieved by different thicknesses of one material. A skilled artisan would recognize that mechanical stiffness can be controlled by choosing different materials for the first and second mechanical layers, selectively choosing the same or different thicknesses for the first and second mechanical layers, or altering any number of other characteristics. A person of skill in the art would recognize that driving a variety of MEMS devices, having different cavity sizes, with a single voltage may in certain instances be highly desirable. Different stiffnesses of the overlying mechanical layer can compensate for the difference in optical cavity size of the different MEMS devices while maintaining a single driving voltage capable of collapsing such differently sized MEMS devices from an open state to a closed state. By modulating the stress through choosing different thicknesses, materials, and deposition conditions for each deposition, the stiffness of the mechanical layers of the three MEMS devices can be controlled by only two depositions and two masks for patterning and etching. A person of skill in the art would make such modifications to the above description within the scope of the present invention.

It is to be understood that a similar process (not shown) of forming three thickness with two depositions and two masks can be applied to the dielectric layer 850. By forming three dielectric layer thicknesses using a first dielectric layer deposition and a second dielectric layer deposition on the first, second, and third regions 805, 807, 809, the first, second, and third MEMS structures 880, 885, 890 can produce wavelengths of light corresponding to three different colors when the first, second, and third MEMS structures are in a closed or collapsed state.

It will be appreciated that a person of skill in the art would recognize that the above embodiments describe devices having three MEMS structures with three optical cavity thicknesses, three mechanical layer stiffnesses, or three dielectric layer thicknesses produced through two depositions and two masks. As the skilled artisan will readily appreciate, however, the process can be readily extended to form devices with x number of different MEMS structures with x number of optical cavity thicknesses, x mechanical layer stiffnesses, and/or x number of dielectric layer thicknesses, each produced by only x-1 depositions and x-1 masks for patterning. It should also be understood that the processes described here can also be used to form various other layers within a MEMS device such that they have different thicknesses in respective areas of the device. A person of skill in the art would also recognize that embodiments described may also be applied to other MEMS structures, for example, but not limited to, the MEMS devices of FIGS. 7A-7E.

It will be appreciated by those skilled in the art that various other omissions, additions and modifications may be made to the methods and structures described above without departing from the scope of the invention. All such modifications and changes are intended to fall within the scope of the invention, as defined by the appended claims.

What is claimed is:

1. A method for forming at least a first microelectromechanical systems (MEMS) device, a second MEMS device, and a third MEMS device, in a first region, a second region, and a third region, respectively, the method comprising:
   providing a substrate in a reaction chamber;
   depositing a first sacrificial layer onto the first, second and third regions of the substrate;
   patterning and etching the first sacrificial layer by removing the first sacrificial layer from the second region, while keeping the first sacrificial layer on the first and third regions;
   depositing a second sacrificial layer onto the first, second and third regions of the substrate; and
   patterning and etching the second sacrificial layer by removing the second sacrificial layer from the third region, while keeping the second sacrificial layer on the first and second regions.

2. The method of claim 1, further comprising removing any remaining material of the first and second sacrificial layers from the first, second, and third regions to define MEMS cavities of three different sizes.

3. The method of claim 1, further comprising depositing a third sacrificial layer onto the first, second, and third regions of the substrate and patterning and etching the third sacrificial layer by removing the third sacrificial layer from at least one of the first, second, and third regions.

4. The method of claim 1, wherein the first and second sacrificial layers comprise at least one of molybdenum and amorphous silicon.

5. The method of claim 1, further comprising depositing a thin film etch stop layer prior to at least one of depositing a first sacrificial layer and depositing a second sacrificial layer, wherein the thin film etch stop inhibits etching a layer underlying at least one of the first sacrificial layer and the second sacrificial layer.

6. The method of claim 5, wherein the etch stop layer is between about 100 Å and 1000 Å.

7. The method of claim 5, wherein patterning and etching comprises etching with $XeF_2$.

8. The method of claim 5, wherein the thin film etch stop layer comprises silicon nitride.

9. The method of claim 5, wherein the thin film etch stop layer comprises at least one of Al, Cr, and Ni.

10. The method of claim 5, further comprising removing the thin film etch stop layer simultaneously with the sacrificial layers.

11. The method of claim 1, wherein the first region has a first thickness, the second region has a second thickness, and the third region has a third thickness, wherein the first, second, and third thicknesses correspond to the summation of the thicknesses of at least one of the first and second sacrificial layers and etch stop layer in the first, second, and third regions, and wherein the first thickness produces a second order blue color in an open state, the second thickness produces a first order green color in an open state, and the third thickness produces a first order red color in an open state.

12. The method of claim 1, wherein the first sacrificial layer has a first thickness and the second sacrificial layer has a second thickness and wherein the first and second thicknesses are different.

13. A method of forming x number of different microelectromechanical systems (MEMS) structures on x regions of a substrate using x-1 depositions and x-1 masks wherein each of the x number of MEMS structures has a unique characteristic, wherein each characteristic corresponds to at least one of a first material and a second material, the method comprising:
depositing the first material onto the substrate;
patterning and etching the first material by removing the first material from at least one region of the substrate;
depositing an etch stop layer over the first material;
depositing the second material over the etch stop layer; and
patterning and etching the second material by removing the second material from at least one different region of the substrate,
wherein x is greater than or equal to 3.

14. The method of claim 13, wherein the first material is different than the second material.

15. The method of claim 13, wherein the first material is the same as the second material.

16. The method of claim 15, wherein the first material and the second material have different thicknesses.

17. The method of claim 13, wherein the first material and the second material comprise at least one material characteristic, wherein the material characteristic is chosen from a group consisting of thickness, stiffness, stress, resistance to etching, conductivity, and resistivity.

18. The method of claim 17, wherein at least one material characteristic of the first material differs from at least one material characteristic of the second material.

19. The method of claim 13, wherein the x number of different MEMS structures comprise x number of different sacrificial structures having x number of different sacrificial structure thicknesses and wherein the x number of sacrificial structures are formed by x-1 sacrificial layer depositions and x-1 masks.

20. The method of claim 13, wherein the x number of different MEMS structures comprise x number of mechanical structures having x number of mechanical structure stiffnesses and wherein forming the x number of mechanical structures comprises:
depositing x-1 mechanical layers; and
conducting x-1 mask steps.

21. A method of forming x number of different microelectromechanical systems (MEMS) structures on x regions of a substrate using x-1 depositions and x-1 masks wherein each of the x number of MEMS structures has a unique characteristic, wherein each characteristic corresponds to at least one of a first material and a second material, the method comprising:
depositing the first material onto the substrate;
patterning and etching the first material by removing the first material from at least one region of the substrate;
depositing the second material onto the substrate; and
patterning and etching the second material by removing the second material from at least one different region of the substrate,
wherein at least one of the first and second material comprises a dielectric material and wherein x is greater than or equal to 3.

22. The method of claim 21, wherein the dielectric material is chosen from a group consisting of SiN, $SiON_x$, and $SiO_2$.

23. The method of claim 21, wherein the x number of MEMS structures comprise at least a first, second, and third MEMS device in a first, second, and third region and wherein patterning and etching the first material comprises removing the first material from the second region, while keeping the first material on the first and third regions.

24. The method of claim 23, wherein patterning and etching the second material comprises removing the second material from the third region, while keeping the second material on the first and second regions.

25. The method of claim 24, further comprising depositing an etch stop layer after depositing the first material and the second material, wherein the etch stop layer is chosen from a group consisting of $SiN_x$ and $Al_2O_3$.

26. The method of claim 24, wherein the first, second, and third MEMS devices are each configured to reflect a different color in an unactuated state.

27. A method of forming x number of different microelectromechanical systems (MEMS) structures on x regions of a substrate using x-1 depositions and x-1 masks wherein each of the x number of MEMS structures has a unique characteristic, wherein each characteristic corresponds to at least one of a first material and a second material, the method comprising:
depositing the first material onto the substrate;
patterning and etching the first material by removing the first material from at least one region of the substrate;
depositing the second material onto the substrate; and
patterning and etching the second material by removing the second material from at least one different region of the substrate,
wherein the x number of different MEMS structures comprise x number of different optical stacks having x number of different optical stack thicknesses and wherein x is greater than or equal to 3.

28. A method for forming at least a first microelectromechanical systems (MEMS) device, a second MEMS device, and a third MEMS device in a first region, a second region, and a third region, respectively, the method comprising:
providing a substrate in a reaction chamber;
depositing a first mechanical layer onto the first, second, and third regions of the substrate;
patterning and etching the first mechanical layer by removing the first mechanical layer from the second region, while keeping the first mechanical layer on the first and third regions;
depositing a second mechanical layer onto the first, second and third regions of the substrate; and
patterning and etching the second mechanical layer by removing the second mechanical layer from the first region, while keeping the second mechanical layer on the second and third regions.

29. The method of claim 28, wherein the first mechanical layer comprises a first mechanical layer thickness and the second mechanical layer comprises a second mechanical layer thickness, wherein the first mechanical layer thickness differs from the second mechanical layer thickness.

30. The method of claim 28, wherein the first mechanical layer comprises a first mechanical layer material and the second mechanical layer comprises a second mechanical layer material, wherein the first mechanical layer material differs from the second mechanical layer material.

31. The method of claim 28, wherein the first mechanical layer comprises a first mechanical layer stiffness and the second mechanical layer comprises a second mechanical layer stiffness, wherein the first mechanical layer stiffness differs from the second mechanical layer stiffness.

32. The method of claim 28, wherein the first and the second mechanical layers comprise at least one of Ni and Cr.

33. The method of claim 28, further comprising depositing an etch stop layer, wherein the etch stop layer comprises at least one of Al, Cr, and Ni.

34. The method of claim 28, wherein the first, second, and third MEMS devices each produce a different color in an open state.

35. The method of claim 34, wherein the first, second, and third MEMS devices produce a second order blue color, a first order green color, and a first order red color.

* * * * *